United States Patent [19]

Tatsushi et al.

[11] Patent Number: 4,498,040
[45] Date of Patent: * Feb. 5, 1985

[54] REFERENCE VOLTAGE CIRCUIT

[75] Inventors: Asakawa Tatsushi; Morozumi Shinji, both of Suwa, Japan

[73] Assignee: Kabushiki Kaisha Suwa Seikosha, Tokyo, Japan

[*] Notice: The portion of the term of this patent subsequent to Mar. 24, 1998 has been disclaimed.

[21] Appl. No.: 445,402

[22] Filed: Nov. 30, 1982

Related U.S. Application Data

[63] Continuation of Ser. No. 150,485, May 16, 1980, Pat. No. 4,377,781, which is a continuation of Ser. No. 900,214, Apr. 26, 1978, Pat. No. 4,258,310.

[30] Foreign Application Priority Data

Apr. 26, 1977 [JP] Japan .................................. 52-48290
Apr. 26, 1977 [JP] Japan .................................. 52-48291

[51] Int. Cl.³ ............................................. G05F 3/20
[52] U.S. Cl. ..................................... 323/299; 323/313
[58] Field of Search ............... 307/296 R, 297, 304, 307/360-362; 323/281, 297, 299, 303, 313, 314; 368/204, 205

[56] References Cited

U.S. PATENT DOCUMENTS 3,832,644  8/1974  Nagata et al. ................... 323/313 X
4,011,471  3/1977  Rockett .......................... 323/313 X
4,100,437  7/1978  Hoff ..................................... 307/297

Primary Examiner—William M. Shoop
Attorney, Agent, or Firm—Blum Kaplan Friedman Silberman & Beran

[57] ABSTRACT

A voltage detection integrated circuit including a voltage regulation circuit for controlling the operation thereof is provided. The voltage detection integrated circuit includes a reference voltage circuit for producing a predetermined reference voltage, a voltage converter for converting a detected voltage for measurement and a comparator circuit for comparing the level of the reference voltage to the level of the converted voltage and for producing a comparison signal representative of the difference in voltage levels compared thereby. The voltage regulation circuit is coupled to the comparator circuit and the reference voltage circuit and/or voltage conversion circuit for selectively adjusting the level of the reference voltage produced by the reference voltage circuit and/or the converted voltage produced by the voltage converter, to thereby control the comparison signal produced by the comparator circuit.

8 Claims, 22 Drawing Figures

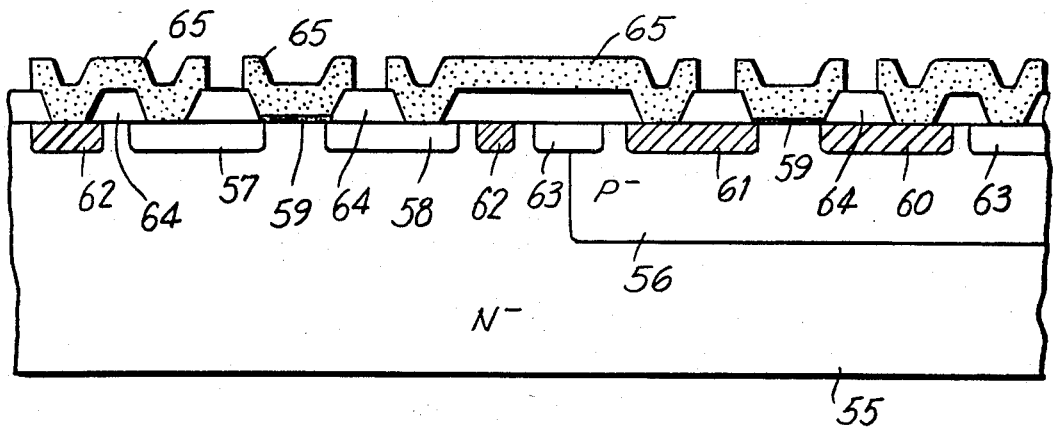
FIG.4a
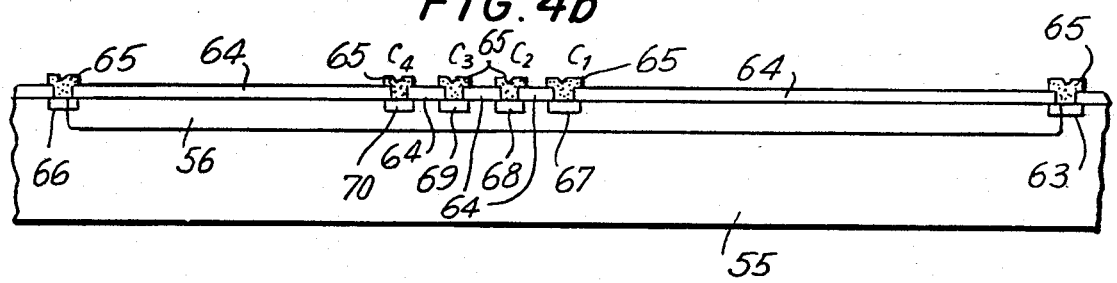
FIG.4b
FIG.4c
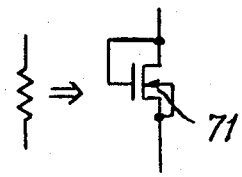
FIG.4d
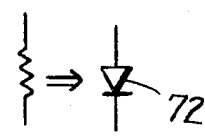
FIG.4e
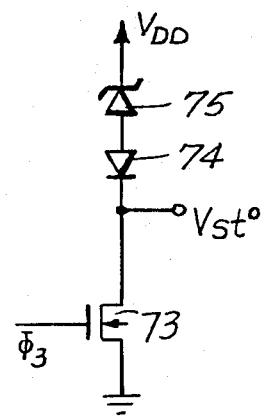

REFERENCE VOLTAGE CIRCUIT

This is a continuation of application Ser. No. 150,485, filed May 16, 1980 now U.S. Pat. No. 4,377,781, issued Mar. 22, 1983 which is itself a continuation of Ser. No. 900,214, filed Apr. 26, 1978, now U.S. Pat. No. 4,258,310, issued Mar. 24, 1981.

BACKGROUND OF THE INVENTION

This invention is directed to a voltage detection integrated circuit, and in particular to a voltage detection circuit that is fully adjustable as a result of an adjustment circuit that is integrated into the same circuit chip as the remaining circuits comprising the voltage detection circuit.

Heretofore, voltage detection circuits of the type known in the art have compared a voltage produced by a voltage source with a set voltage and produced a comparison signal representative thereof. Accordingly, the detecting voltage, or set voltage, is varied by utilizing an adjustment element such as a variable resistor or, alternatively, by replacing or changing the resistors in the circuit. Although the latter approach is permissible when the voltage detection circuit is not an integrated circuit, when the voltage detection circuit is integrated into a circuit chip, it is necessary to provide a variable resistor that is mechanically coupled to the voltage detection circuit and must be manually adjusted in order to permit either the set voltage or the voltage to be detected to be varied.

This type of manual adjustment is extremely difficult to effect and the finer the adjustment required, the more costly it becomes. Moreover, regulation of the voltage detection circuit is often necessitated by fluctuations in the electrical characteristics of passive and active elements utilized, not only in the voltage detection circuit, but in the circuitry that the electronic detection circuit is coupled to. Thus, in comparison to the considerable cost savings that obtains when a voltage detection circuit and, additionally, the circuitry in which same is included are integrated into the same circuit chip, adjustment of the voltage detection circuitry by manually varying an impedance element is time consuming, extremely costly and is a less completely satisfactory method of adjusting the operating characteristics of an integrated voltage detection circuit.

SUMMARY OF THE INVENTION

Generaly speaking, in accordance with the instant invention, an integrated voltage detection circuit having a fully electronic regulation circuit is provided. The voltage detection circuit is provided for detecting the level of the voltage produced by a voltage source. The voltage detection circuit includes a reference voltage circuit for producing a set reference voltage and a voltage converter for procuding a converted voltage representative of the voltage delivered by the voltage supply. A comparator is adapted to receive the set reference voltage and the converted voltage and produce a comparison voltage signal in response thereto. The regulating circuit is coupled to the comparator and to either the reference voltage circuit or the converter circuit for selectively varying either the set reference voltage produced by the reference voltage circuit or the converted voltage produced by the voltage converter circuit in order to control the comparison voltage signal produced by the comparator circuit.

Accordingly, it is an object of the instant invention to simplify and reduce the cost of adjusting an integrated voltage detection circuit by integrating therein a voltage regulation circuit.

A further object of the instant invention is to provide an integrated voltage detection circuit that is operated by a differential pulse to reduce the current consumption thereof.

Another object of the instant invention is to provide a voltage detection circuit wherein the reference voltage is stable against variations in temperature, variations in the power supply and variations in manufacturing techniques.

Still another object of the instant invention is to provide a voltage detection circuit wherein a linear conversion of different threshold voltages of the active circuit elements is used to determine a reference voltage.

Still a further object of the instant invention is to provide a voltage detection circuit wherein the voltage to be detected is linearly converted by resistive networks and is adjusted by a ratio of the resistors carrying the resistance network.

Yet another object of the instant invention is the use of non-volatile memory elements in the regulation of integrated voltage detection circuits.

Still other objects and advantages of the invention will in part be obvious and will in part be apparent from the specification.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which:

FIG. 3b is a sectional view of an MOS transistor included in the voltage follower operational circuit depicted in FIG. 3a;

FIG. 4a is a sectional view of an MOS integrated circuit substrate having doped P-channel transistors;

FIG. 4b is a sectional view of an MOS circuit including an integrated circuit substrate having resistors integrated therein;

FIG. 4c is a circuit diagram of an MOS resistor;

FIG. 4d is an illustration of a diode for use in the voltage detection circuit depicted in FIG. 2;

FIG. 4e is a circuit diagram of a further embodiment of a voltage reference circuit for use in the voltage detection circuit of the instant invention;

FIG. 5b is a sectional view of an FAMOS circuit substrate for forming the FAMOS elements depicted in FIG. 5a;

FIG. 5c is a plan view of the circuit substrate incorporating the adjustment control circuit depicted in FIG. 5a;

FIG. 12b is a wave diagram illustrating the operation of the multi-level voltage detection circuit depicted in FIG. 12a.

DETAILED DESCRIPTION OF THE PREFERRED EMBODIMENTS

Figure 1:
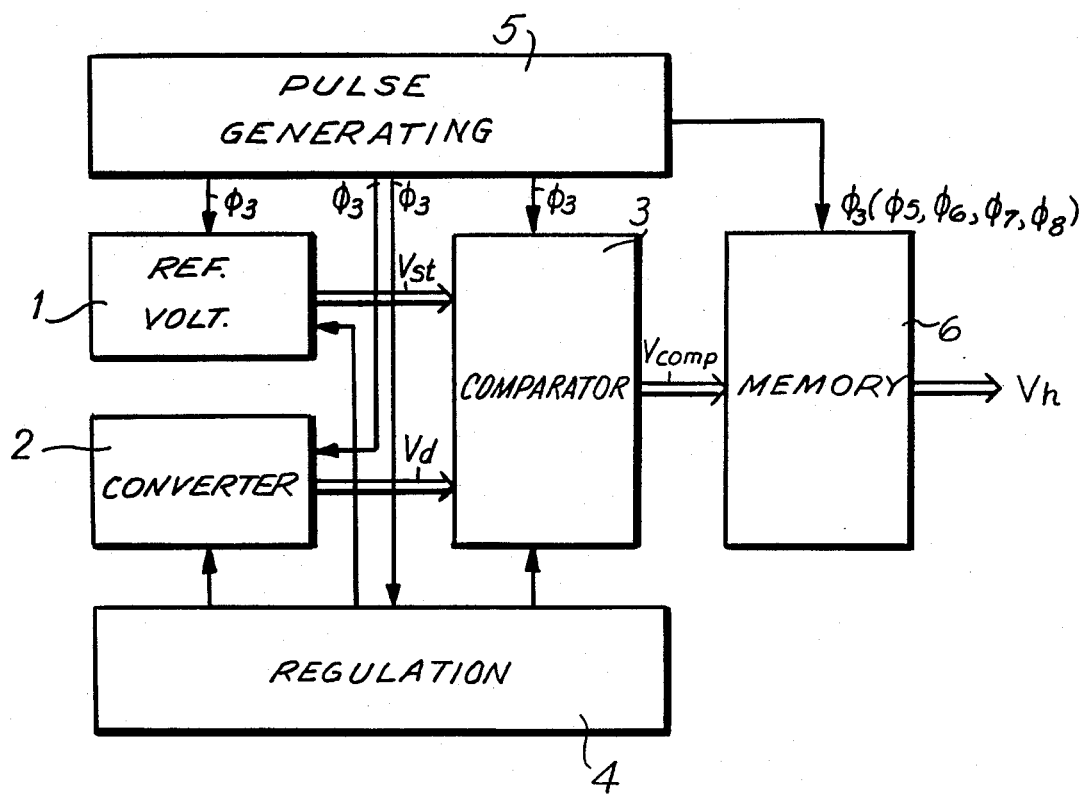
FIG. 1 is a block circuit diagram of a voltage detection circuit constructed in accordance with a preferred embodiment of the instant invention.

Reference is now made to FIG. 1, wherein a voltage detection circuit, constructed in accordance with the instant invention, is depicted. A voltage reference circuit 1 is provided for generating a reference voltage $V_{st}$, which reference voltage is a set voltage to be utilized as a comparison voltage with respect to the detected voltage. Moreover, as is detailed below, the reference voltage circuit 1 is adapted to provide a set reference voltage that is independent of the fluctuations in the detected voltage.

A voltage converter circuit 2 is provided for detecting the voltage of the voltage source and for converting same to a detected voltage to be compared with the set reference voltage. The detected voltage $V_d$, produced by the voltage converter circuit 2, is compared with the set reference $V_{st}$ by a comparator circuit 3. As is set forth in greater detail below, by selecting a predetermined set reference voltage, the operation of the comparator circuit and, in particular, the comparison voltage $V_{comp}$ produced thereby indicates the state of the voltage source being detected.

A regulation circuit 4 is coupled to the reference voltage circuit 1, voltage converter circuit 2 and comparator circuit 3 and includes an adjustment circuit to be described in greater detail below. The regulation circuit 4 regulates the reference voltage circuit 1 and/or the voltage converter circuit 2 to thereby establish the operating parameters of the comparator circuit 3.

The reference voltage circuit 1, voltage converter circuit 2, comparator 3 and regulation circuit 4 are each operated by the same power source and, accordingly, consume current during operation. Thus, when incorporated into a small-sized portable electronic instrument wherein a limited power supply, such as a DC battery is utilized to energize the instrument, a pulse generating circuit is provided for reducing the power consumption and, hence, reducing the rate at which the power supply that energizes the circuits is dissipated. Pulse generating circuit 5 is adapted to generate differential pulses $\phi_3$ ($\phi_5$, $\phi_6$, $\phi_7$, $\phi_8$) which pules are utilized as sample pulses for selectively energizing the reference voltage circuit 1, voltage converter circuit 2, comparator circuit 3 and regulation circuit 4 in a manner to be discussed in greater detail below.

Finally, in view of the use of a pulse generating circuit 5 for selectively energizing the voltage detection circuit for short intervals of time, a memory circuit 6 is provided for storing the output of the comparator 3 during the intervals of time that the sampling pulses are not produced by the pulse generating circuit 5. As is detailed at length below, the voltage detection circuit, the reference voltage circuit 1, voltage converter circuit 2, comparator 3, regulation circuit 4, pulse generating circuit 5 and memory 6 are each integrated into the same circuit chip and thereby permit the regulation circuit to electronically adjust the voltage detection circuit and thereby eliminate the necessity of mechanical adjustment once the voltage detection circuit is integrated into the same circuit chip.

Figure 2:
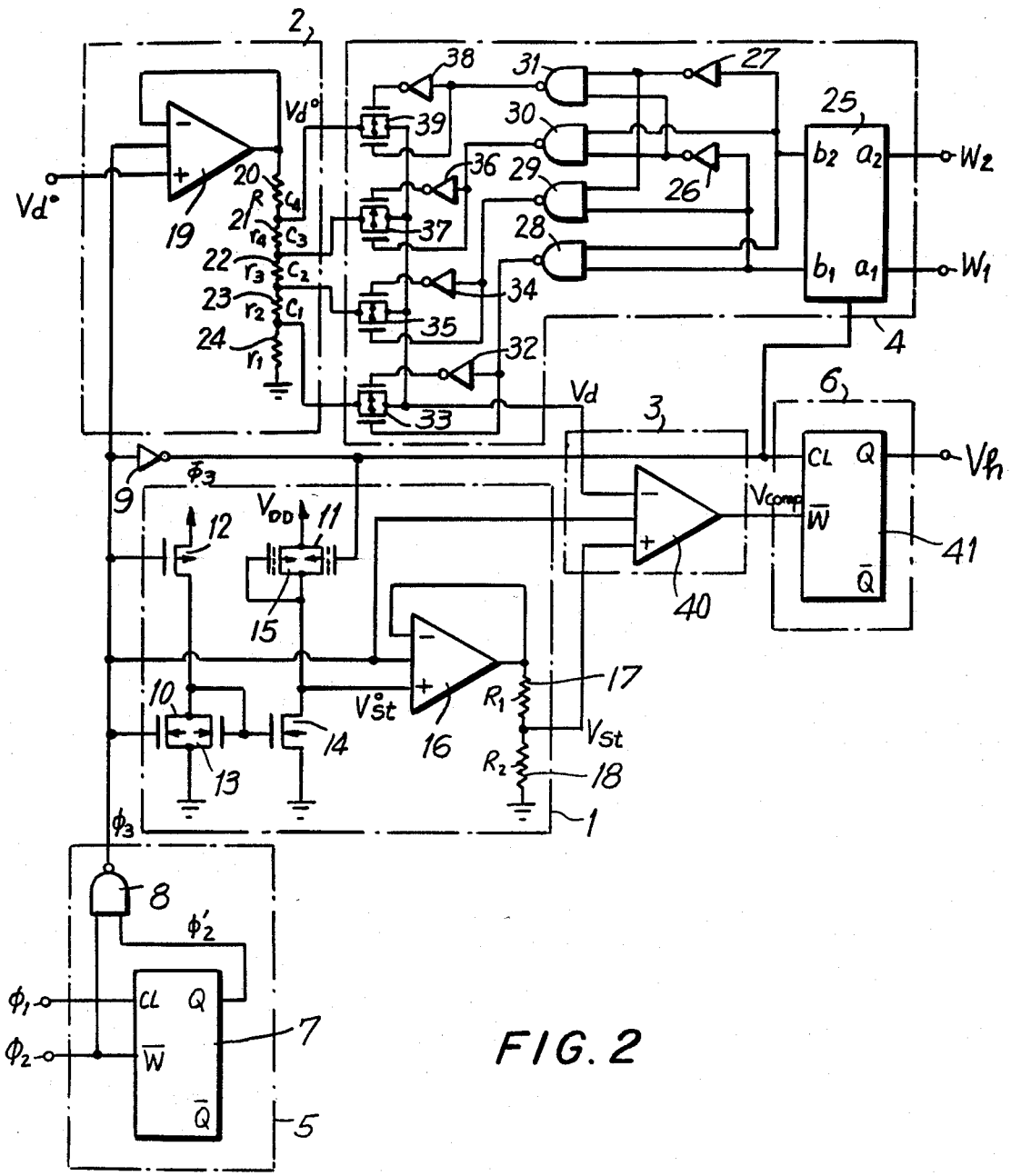
FIG. 2 is a circuit diagram of an exemplary embodiment of the voltage detection circuit depicted in FIG. 1.

Reference is now made to FIG. 2, wherein an exemplary embodiment of the voltage detection circuit, depicted in FIG. 1, and, in particular, the adjustment circuit therefor is depicted. Each of the dot and dashed blocks identify the circuits described above with respect to FIG. 1, like reference numerals being utilized to denote like circuits. Moreover, as will become evident by the discussion herein, the active elements to be utilized in the circuit are insulated gate type field-effect transistors, hereinafter referred to as "MOS transistors" in order to obtain the objects of the instant invention.

Figure 7A:
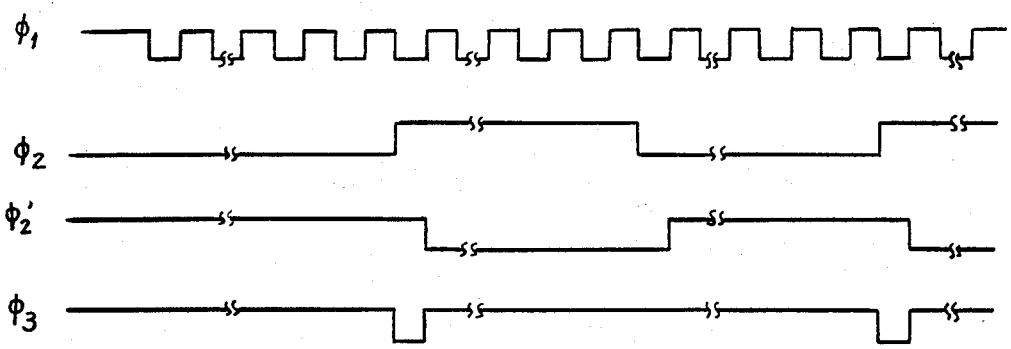
FIG. 7a is a wave diagram illustrating the operation of the pulse generating circuit illustrated in FIG. 2.
Figure 7B:
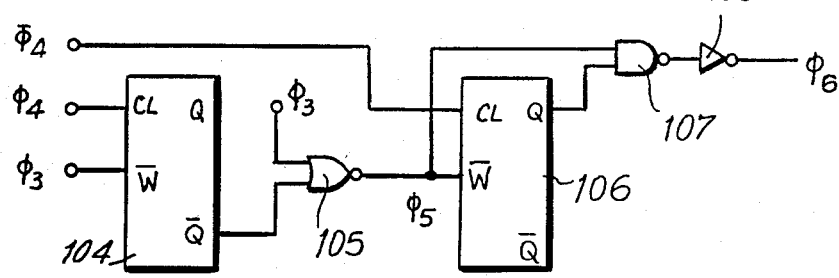
FIG. 7b is a circuit diagram of a pulse generating circuit constructed in accordance with an alternative embodiment of the instant invention for use in the voltage detection circuit depicted in FIG. 2.
Figure 7C:
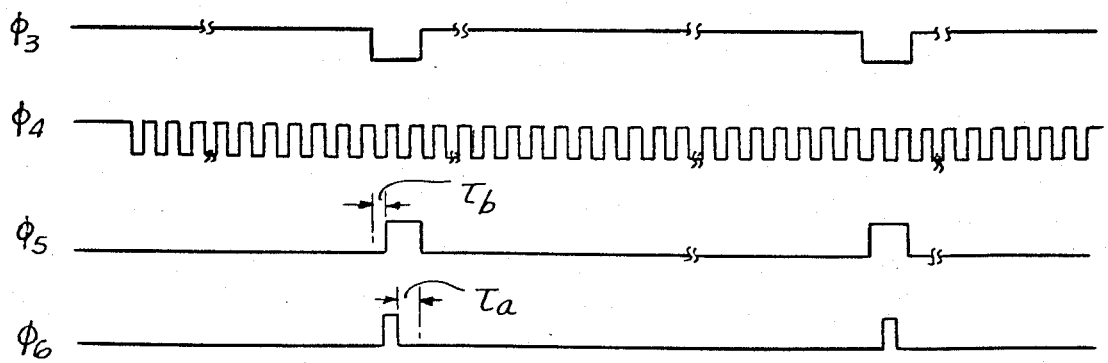
FIG. 7c is a wave diagram illustrating the operation of the pulse generating circuit depicted in FIG. 7b.

A pulse generating circuit 5 is comprised of a shift register 7, which shift register is defined by a flip-flop, and a NAND gate 8 coupled to the Q output of the shift register 7. The operation of the pulse generating circuit 5 is illustrated by the wave diagram, depicted in FIG. 7a. Specifically, if a high frequency clock signal $\phi_1$ is applied to the clock terminal CL of shift register 7, and a lower frequency signal $\phi_2$ is applied to the write terminal W of shift register 7, the output signal $\phi'_2$, produced at the Q output of the shift register 7, will equal the duty cycle of the lower frequency signal $\phi_2$ but will be shifted in phase by an amount equal to one-half the period of the clock signal $\phi_1$. By applying the clock signal $\phi_1$ to a first input of NAND gate 8 and phase shifted signal $\phi'_2$ to the other input of NAND gate 8, a differential pulse $\phi_3$, having a duty cycle equal to one-half the period of the clock pulse $\phi_1$ and occurring once during each period of the low frequency signal $\phi_2$, is produced at the output of NAND gate 8. If, for example, $\phi_1$ is a 64 Hz signal and $\phi_2$ is a 0.5 Hz signal, then a low level differential pulse, having a period of 1/128 seconds and a high level for 2-1/128 seconds is produced at the output of NAND gate 8. As is explained in greater detail below, the differential pulse $\phi_3$, produced at the output of NAND gate 8, is utilized to drive the voltage reference circuit 1, voltage converter circuit 2, comparison circuit 3, regulation circuit 4 and memory circuit 6 during the duration of the differential pulse to thereby reduce the current consumption of each of these circuits.

Figure 6:
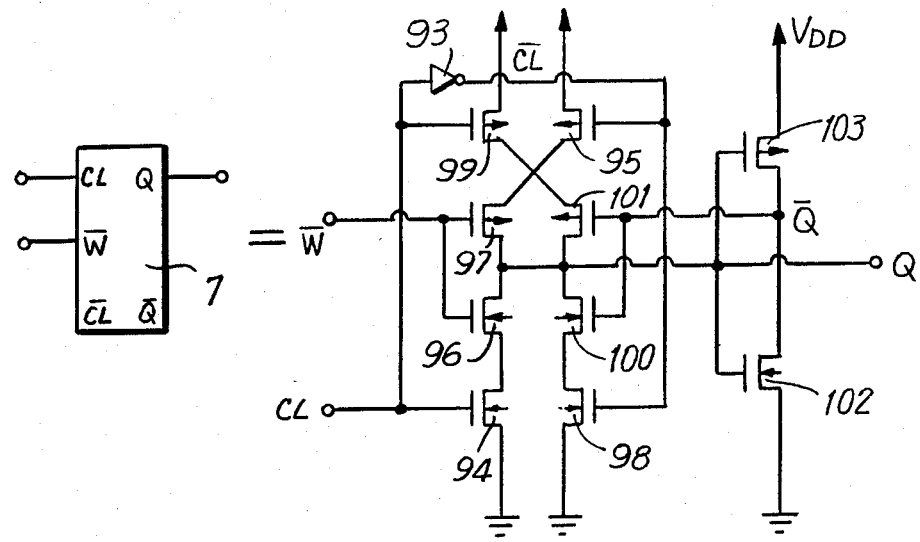
FIG. 6 is a detailed circuit diagram of a flip-flop shift register utilized in the voltage detection circuit depicted in FIG. 2.

Reference is also made to FIG. 6, wherein a detailed circuit diagram of shift register 7 comprised of MOS transistors is depicted. The clock signal CL is adapted to be inverted by an inverter 93 so that N-channel transistors (hereinafter referred to as "NT") 94 and P-channel transistors (hereinafter referred to as "PT") 95 are turned ON when CL is a HIGH level signal. In such event, the write in input $\overline{W}$ is inverted and written into a memory as $\overline{\overline{W}}$ by means of an inverter formed of NT 96 and PT 97, thereby making the output Q equal to $\overline{W}$. NT 102 and PT 103 comprise a further inverter so that the output $\overline{Q}$ equals $\overline{W}$ and, at this time, NT 98 and PT 99 are turned OFF. NT 98 and PT 99 are turned ON only when the clock signal CL becomes a LOW level signal. At this time, $\overline{Q} = \overline{W}$ is inverted so that $Q = \overline{\overline{Q}} = \overline{\overline{W}}$ by the inverter comprised of NT 100 and PT 101 so that the state of the output signal Q is temporarily stored thereat. At this time, NT 94 and PT 95 are turned OFF or, stated otherwise, Q does not undergo a change of state even if $\overline{W}$ is changed in state when the clock signal CL is a LOW level signal and when the clock signal CL becomes a HIGH level signal, the change of state $\overline{W}$ is transmitted to the Q output. Accordingly, the signal shifted from $\overline{W}$ for one-half the period of the clock signal CL is produced at the output $\overline{Q}$ and the signal $\overline{W}$ shifted from $\overline{W}$ is inverted and appears at Q, in order to effect the operation described above. Thus, by utilizing the pulse generating circuit 5, including an MOS transistor shift register 7, the current consumption for each of the circuits driven by the differential pulse $\phi_3$ is reduced by an average of 1/256 the amount of current that would be utilized in the absence of such a pulse generating circuit and this reduction in current consumption is a first characteristic feature of the instant invention.

The reference voltage circuit 1 is coupled to the pulse generating circuit 5 in order to receive the differential pulse $\phi_3$ produced thereby. The differential pulse $\phi_3$ is applied to NT 10, PT 12 and is further coupled through an inverter 9 to PT 11. Accordingly, NT 10 is turned OFF when $\phi_3$ is a LOW level signal and PT 11 is turned OFF when $\phi_3$ becomes a HIGH level signal. The static characteristic of the reference voltage circuit 1 is therefore independent of the state of transistors 10 and 11. Moreover, as will be explained in greater detail below, the operational amplifier 16, illustrated in detail in FIG. 3a, has no relationship with the transistors 42 and 54 since same are to be turned OFF. However, when the differential pulse $\phi_3$ is a HIGH level pulse, PT 12 is turned OFF and NT 10 is turned ON, thereby defining a LOW level drain voltage at NT 10 so that NT 14 is turned OFF and PT 11 is turned ON. In this condition, no current flow through the voltage reference circuit is effected. Moreover, referring to FIG. 3a, in the operational amplifier 16, PT 43 is turned OFF and NT 42 is turned ON so that NT 44, NT 45 and NT 50 are turned OFF to thereby prevent any current flow. Also, at this time, PT 54 is turned ON thereby turning PT 51 OFF so that the current flow through output resistors 17 and 18, positioned at the output of operational amplifier 16, is prevented.

It is a characteristic of the instant invention that the set reference voltage, produced by the voltage reference circuit 1, when the differential pulse $\phi_3$ is a LOW level signal, does not depend on the detected voltage or the supply voltage ($V_{DD}$) and does not vary as a result of temperature characteristics of the circuit components forming same. Accordingly, the reference voltage circuit of the instant invention is characterized by the use of the threshold voltages of the MOS transistors for determining the level of the set reference voltage produced by the voltage reference circuit. To this end, it is necessary to vary the threshold voltages of the MOS transistors and, in a preferred embodiment of the instant invention, such variations are effected by doping the gate part of the channel with ion implantation. Ion implantation is selected in order to take into account differences in gate film thickness and/or differences in substrate concentration. Specifically, the temperature characteristics of the threshold voltage and the conductance coefficient ($\alpha$ mobility) are largely different between MOS transistors, having different threshold values. By doping the lower gate portion of the channel, specifically doping donor ions in P-channel transistors, or doping acceptor ions in N-channel transistors, has as much an effect on temperature characteristics of such transistors as differences in substrate concentrations. Accordingly, in channel doping, it is preferred to dope accepter ions in P-channel transistors and donor ions in N-channel transistors.

The shift, or amount, that the threshold voltage is lowered by doping is represented by the formula $$\frac{q\, N_{net}\, \tau_{ox}}{\epsilon_o\, \epsilon_{ox}},$$

wherein q is the net quantity of charge, $\epsilon_{ox}$ is the relative dielectric constant of the gate insulating film, $\epsilon_o$ is the vacuum dielectric constant, $\tau_{ox}$ is the thickness of the gate insultating film, and $N_{net}$ is the quantity of ion implantation. As is demonstrated by the above formula, the amount of voltage shift is not temperature related. Moreover, with respect to conductance coefficient ($\alpha$ mobility), the variation in its absolute value can be experimentally corrected so long as the geometrical dimensions are controlled, and accordingly a variation, as a result of changes in temperature characteristics, is considerably less than in the cases mentioned above. Accordingly, an accepter ion for doping a P-channel transistor, in accordance with the instant invention, is, for example $^{11}B+$ and a donor ion to be doped into an N-channel transistor is, for example, $^{31}P+$. In FIGS. 2 through 12 of the drawings of this application, each of the transistors, having their threshold voltages shifted by channel doping of the type detailed above, are illustrated by a dashed line between the gate electrode and the connection of the source and drain electrodes.

A shifting of the threshold voltages in the exemplary embodiments, illustrated in the drawings, is achieved by doping the P-channel transistors so that the threshold voltage of the N-channel transistors is determined relative to the substrate concentration of the threshold voltage of the doped P-channel transistors. Specifically, reference is made to FIG. 4a, wherein a C-MOS construction depicting doped P-channel transistors of the instant invention is shown. It is noted that the P$^-$ well 56 is formed in the N$^-$ silicon substrate 55. Additionally, isolation layer 63, for the N-channel transistor, is formed by a P-type diffusion layer or by ion implantation and is formed either simultaneously with, or independently of, the source region 57 and drain region 58 of the P-channel transistor. The isolation layer 62 for the P-channel transistor is formed by an N-type diffusion layer, either at the same time or independently of the forming of the source region 60 and drain region 61 of the N-channel transistor. Insulating film 59 is a substantially clean insulating film and defines the gate between the source region 61 and drain region 60 of the N-channel transistor. A gate insulating film 64 defines a gate between the source region 58 and drain region 57 of the P-channel transistor and is formed beneath the metal gate electrode 65, which electrodes are preferably formed of suitable wiring materials such as aluminum. After the gate insulating film 59 is formed during fabrication of the integrated circuit chip, photo-resist masks are used to cover each of the channels other than the channels that are to be doped, whereafter ions are doped into the desired channels at the gate insulating film, so that the threshold voltage of the transistors not covered by a photo-resist mask are lowered. Moreover, the threshold characteristics of the transistors that are masked are not subject to any change as a result of the doping. Alternatively, the channel doping for each of the transistors of the same polarity can be effected, whereafter only selected transistors can be further doped to change the threshold level thereof. The instant invention is characterized by a difference in the threshold level of the P-channel and N-channel transistors, the explanation of the method of forming same being presented herein by way of enablement.

Once again, referring to FIG. 4a, the threshold voltage of the N-channel transistors for use with P-channel transistors having a lower threshold value, are readily obtained by lowering the concentration of ions in the P− well 56. Alternatively, during forming of the integrated circuit chip, each of the channels of the N-channel transistors can be doped with donor ions after the gate insulating film is formed, notwithstanding a comparatively high P− concentration in the P− well 56. In either case, the differences in threshold voltage obtained by channel doping establishes a predetermined reference voltage that is stable against variations in temperature, variations in the voltage delivered by the power supply. Also, uniform set reference voltage is obtained by manufacturing the integrated circuit with a high stability and by taking into account the quantity of ion implantation ($N_{net}$) and the thickness of the gate insulating film. Accordingly, a further feature of the instant invention is that a reference voltage, that is stable with respect to variations in temperature, variations in the supply voltage and variations in the manufacturing yield, is provided.

Once again, referring to FIG. 2, and in particular the voltage reference circuit 1 depicted therein, the ratio of conductance coefficient $$\left(\text{which equals mobility} \times \frac{\epsilon_0 \epsilon_{ox}}{\tau_{ox}} \times \frac{\text{channel width}}{\text{channel length}}\right)$$

of PT 12 to the conductance coefficient of PT 15 is substantially equal to the ratio of the conductance coefficient of NT 13 to the conductance coefficient of NT 14. Moreover, NT 13 and NT 14 are arranged adjacent to each other on the IC chip in order to further improve the matching of the threshold values thereof. As a result of this configuration, a threshold voltage difference $V°_{st} = VTP - VGTP$ wherein VTP is the threshold voltage of PT 12 and VGTP is the threshold voltage of PT 15 with both transistors being referenced to ground. By way of example, the ratio of this conductance coefficient can be taken as 1. However, the channel length of PT 12 and PT 15, as well as the channel length of NT 13 and NT 14, are respectively made equal. Otherwise, it is difficult to make the ratio of conductance coefficient agree since the depth of the well varies as a result of the different types of diffusion steps performed. Reference voltage $V°_{st}$ is thereafter buffered by voltage follower operational amplifier 16 so that the output of the operational amplifier 16 is divided by resistors 17 ($R_1$) and 18 ($R_2$) to thereby produce a reference output voltage $V_{st}$ which equals $$\frac{R_2}{R_1 + R_2} \times V°_{st}.$$

Figure 3A:
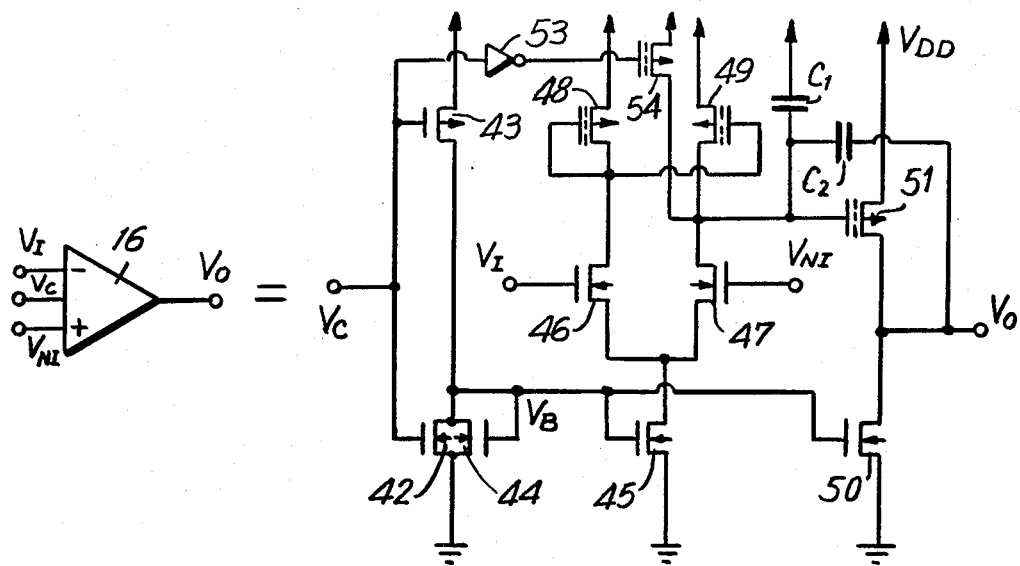
FIG. 3a is a detailed circuit diagram of a C-MOS voltage follower operational amplifier included in the voltage detection circuit depicted in FIG. 2.

The voltage follower operational amplifier 16 is comprised of MOS transistors and is illustrated in detail in FIG. 3a. Referring to FIG. 3a, when $V_c$ is a LOW level signal, NT 42 is turned OFF, thereby further turning PT 54 OFF as a result of the input $V_c$ being inverted by inverter 53. Since PT 43 has a higher threshold voltage and a lower conductance coefficient, than NT 44, the biasing voltage $V_B$ is biased to a level slightly above the threshold voltage of the N-channel transistor. Accordingly, NT 46 is an inverted input transistor and NT 47 is a non-inverted input transistor, which transistors define a current mirror having the same geometrical dimensions and the same electrical characteristics. Load transistors PT 48 and PT 49 are complementary coupled to the inverted input transistor NP 46 and non-inverted input transistor NT 47 and PT 48 and PT 49 are provided with the same electrical characteristics and geometrical dimensions.

If the potential of the inverted input voltage $V_I$ and the non-inverted voltage input $V_{NI}$ applied to inverted input transistor NT 46 and non-inverted input transistor NT 47 respectively are higher than the threshold voltages of NT 46 and NT 47, the current flow, effected through NT 45, is constant, regardless of the magnitude of the potentials and, hence, a ratio of conductance coefficients of PT 49 and PT 51 that is double the ratio of conductance coefficient for NT 45 and NT 50 is obtained. Thus, by arranging PT 49 and PT 51 and, additionally NT 45 and NT 50 adjacent each other to equalize the threshold voltages thereof, an operational amplifier that amplifies only the voltage difference between $V_I$ and $V_{NI}$ is provided. In such event, the ratio of conductance coefficients can be determined by the ratio of the channel width if the channel lengths of PT 49 and PT 51 and NT 45 and NT 50 are equalized.

It is noted that the conductance coefficients of NT 50 and PT 51 are made larger than the conductance coefficients of transistors NT 45, NT 46, NT 47 and PT 48 and PT 49 so that the output will be low in impedance, and the cross-over point will be a great deal higher in frequency than the cross-over of the differential amplification stage comprised of transistors NT 45, NT 46, NT 47, PT 48 and PT 49 and, hence, phase lagging is achieved so that the voltage followers (such as operational amplifier 16) will not oscillate. Additionally if the conductance coefficient is made larger, inevitably, the channel width must also be increased. Accordingly, by increasing the channel widths, the overall capacitance $C_1 + C_2 \times$ (the gain of the amplification output stage), which capacitance is comprised of the parasitic feedback capacitance $C_2$ between the drain and gate of PT 51 and the gate film capacitance $C_1$ of the gate of PT 51, as seen at the drain of PT 49, a more stable frequency characteristic is obtained.

Figure 3B:
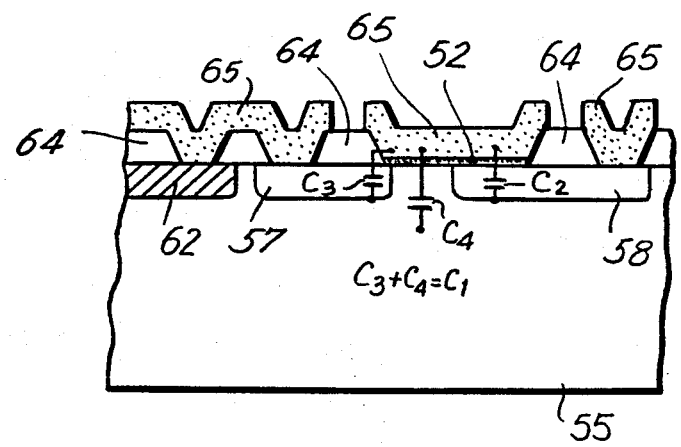

This overall capacitance characteristic is best illustrated in FIG. 3b, wherein a sectional view of transistor 51, illustrated in FIG. 3a, is depicted. Specifically, a metallic film 52, similar to metallic film 59 depicted in FIG. 4a, is provided. The parasitic capacitance $C_2$ is increased because of the increase in channel width. The composite capacitance $C_1$ includes the capacitance $C_3$ between the gate electrode and the source region and the capacitance $C_4$ between the gate and substrate, which capacitances are connected in parallel and are taken as the capacitance between the gate and power supply. This composite capacitance is large because the channel width is large. In order to improve the stability of the circuit, particularly with respect to oscillations, the overlap of the gate and drain in transistor 52 should be increased, whereby the feedback capacitance can be increased at the chip designer's option. It is noted that like reference numerals are utilized in FIG. 3b to denote like elements illustrated and previously described with respect to FIG. 4a.

Still a further problem that is present in fabricating the operational amplifier, depicted in FIG. 3a, is the offset voltages produced in the respective differential amplifier stages. In theory, the offset voltage is on the order of several mV. Thus, by providing a LOW level differential pulse signal $\phi_3$ with a large pulse width, so that the transistor NT 45 functions as a constant current source, the offset voltage is reduced to a negligible value. Thus, the response of the operational amplifier as a result of offset voltages can be minimized only if the differential pulse width is of a sufficiently large duration. However, temperature variations and voltage variations resulting at the offset voltage of the operational amplifier, illustrated in FIG. 3a, are negligible.

The output resistors 17 and 18 ($R_1$ and $R_2$) can be formed in the manner illustrated in FIG. 4b. Specifically, resistors 17 and 18 can be formed as resistors for a C-MOS pair of transistors when the P− well layers form source, drain and isolation layers by using polycrystalline silicons or by diffusion or ion implantation can also be used. FIG. 4b illustrates the manner in which a P− well is used to form the integrated circuit resistors. It is noted, however, that as illustrated in FIG. 4c, the resistors can be comprised of an MOS transistor 71 or, alternatively, diodes of the type illustrated in FIG. 4d can be utilized. The selection of the type of integrated circuit resistance elements depends upon the fabrication processes utilized to manufacture the integrated circuit chip. Nevertheless, the reference voltage $V_{st}$ is determined by the resistance ratio of the resistors, and this ratio is not temperature dependant or voltage dependant and, hence, does not vary. Thus, still a further characteristic of the instant invention is the linear conversion of a difference in the threshold voltages of the MOS transistors utilized to synthesize the voltage reference circuit to obtain a reference voltage based substantially entirely on the linear relationship between the ratio of the resistances.

Stated otherwise, $$\text{since } V_{st} = \frac{R_2}{R_1 + R_2} \times V_{st}^o, V_{st}$$

will equal $V_{st}^o$, when $R_1=0$. This is the case when resistors 17 and 18 are not provided and corresponds to the condition wherein the output $V°_{st}$ of NT 14 and PT 15 is provided as the output $V_{st}$. However, as is discussed below with respect to the comparator circuit 40, the comparator has a high impedance input of the type illustrated in FIG. 3a. Although a silver oxide battery, nickel cadmium battery, mercury battery, etc., can be utilized to obtain a reference voltage or, alternatively, $V°_{st}$ or $V_{st}$ can be applied to the input of the comparator 40. Additionally, the forward threshold voltage of a diode or the Zener voltage of a Zener diode can be utilized to produce a reference voltage that corresponds to the threshold value of the MOS transistor. Specifically, the temperature characteristics of the threshold voltage of a diode and, accordingly, if a diode 74 and Zener diode 75 are coupled in series in the manner illustrated in FIG. 4e, and switching transistor NT 73 is turned ON and OFF by differential pulse $\phi_3$, the forward rising voltage produced by the Zener diode 75 and diode 74 can be used to produce a reference voltage $V°_{st}$ instead of the voltage reference circuit depicted in FIG. 2.

Returning to FIG. 2, the voltage converter circuit 2 is adapted to receive the differential pulse $\phi_3$, and as a result thereof, only consume power during the period that the LOW level signal $\phi_3$ is applied thereto. Specifically, operational amplifier 19 is substantially identical to operational amplifier 16, depicted in detail in FIG. 3a. Accordingly, when $\phi_3$ is a LOW level signal, the operational amplifier 19 is rendered conductive to thereby define a current flow throughout the reference voltage circuit 2 and, in particular, through resistors 20 (R), 21 ($r_4$), 22 ($r_3$), 23 ($r_2$) and $r_1$ (24). Accordingly, operational amplifier 19 functions as a voltage follower so that the detected voltage $V°_d$ is produced as an output $V_o$ in the same manner illustrated in FIG. 3a, and thereafter is divided by the resistance network coupled to the output thereof. If $r_1+r_2+r_3+r_4$ equals $r_T$, the converted voltages produced as a result of the detected voltage are each subject to linear conversion so that at point $c_1$, $$V_{c1} = \frac{r_1}{R + r_T} \times V_d^o; \text{ at point } c_2,$$

$$V_{c2} = \frac{r_1 + r_2}{R + r_T} \times V_d^o; \text{ at point } c_3,$$

$$V_{c3} = \frac{r_1 + r_2 + r_3}{R + r} \times V_d^o, \text{ at point } c_4,$$

$$V_{c4} = \frac{r}{R + r} \times V_d^o.$$

In order to effect the linear conversion detailed above, the resistors of the linear network are fabricated in the integrated circuit in the same manner as resistors 17 and 18 of the voltage reference circuit, which resistors are depicted in FIG. 4b. Specifically, a P− well 56 is formed in the N− silicon substrate 55 at the same time that the N-channel transistor substrate is formed. Thereafter, P-type layers 63, 66, 67, 68, 69 and 70 are respectively formed at the same time that the source drain regions of the P-channel transistors are formed. The P-type layer 63 is grounded by utilizing, for example, aluminum wire. P-type layer 67 corresponds to $c_1$, P-type layer 68 corresponds to point $c_2$, P-type layer 69 corresponds to point $c_3$ and P-type layer 70 corresponds to point $c_4$ in the resistive network so that P-type layer 66 is connected to the output of the operational amplifier 19 by, for example, aluminum wire. Accordingly, the resistance between P-type layer 63 and P-type layer 67 corresponds to resistor 24 ($r_1$), the resistance between P-type layers 67 and 68 corresponds to resistor 23 ($r_2$), the resistance between P-type layers 68 and 69 corresponds to resistor 22 ($r_3$) and the resistance between P-type layers 69 and 70 corresponds to resistor 21 ($r_4$). Also, the resistance between P-type layer 70 and P-type layer 66 corresponds to resistor 20 (R). Finally, a field insulating film 64 provides insulation along the surface with the exception of the openings therein for defining the contact point between the aluminum electrodes 65 and the P-type layers.

It is noted that an advantage that obtains by forming the resistance network of uniform P⁻ well layers is that the ratio of the resistances is neither responsive to changes in temperature characteristics, nor changes in voltage characteristics. A further advantage is that the resistance characteristics of the linear network can be determined accurately and simply on the basis of the geometrical dimension of these layers since the ratio is the prime consideration. To this end, it is preferred that the width of each of the resistors be made uniform so that the ratio is based on the respective lengths of each layer.

It is further noted that four distinct points, such as $c_1$, $c_2$, $c_3$ and $c_4$ are required so that adjustments of the set reference voltage, produced by the voltage detection circuit, can be effected by two binary control bits in a manner to be described in greater detail below. Thus, the instant invention is further characterized by the use of a voltage converting circuit that linearly converts the voltage to be detected, and wherein such conversion is determined solely by a ratio of resistance values. To this end, it is noted that when R equals 0, $V_{c4}$ equals $V°_d$ and the voltage to be detected is applied to switch 39. Thus, the aforementioned set reference voltage $V_{st}$ and the converted voltage $V_d$ are applied to a comparator circuit 3 in a manner to be discussed in greater detail below, to thereby provide voltage detection in accordance with the instant invention. Moreover, as is detailed below with respect to the regulation circuit, the points $c_1$, $c_2$, $c_3$ and $c_4$ are utilized in order to electronically obtain regulation of the detected voltage that is to be compared with the set reference voltage in accordance with the instant invention.

Reference is once again made to FIG. 2, wherein the regulation circuit of the instant invention is depicted. Specifically, regulation circuit 4 is adapted to regulate either of the comparison voltages or both of the comparison voltages supplied to the comparator circuit 3. As aforenoted, two binary control bits are applied to the write terminals $W_1$ and $W_2$ of a shift register 25, to thereby selectively dispose the binary outputs $b_2$ and $b_1$ in one of four possible binary states, I through IV identified below. Specifically, each of the four binary states I through IV are based on the binary state of the signal $b_1$ and $b_2$ and select a detected voltage level $V_d$ at the points $c_1$, $c_2$, $c_3$ and $c_4$ of the resistive network of the voltage detection circuit, in the following manner:

$(b_1, b_2) = (1, 1), V_d = V_{c1}$     I $(b_1, b_2) = (1, 0), V_d = V_{c2}$     II $(b_1, b_2) = (0, 1), V_d = V_{c3}$     III $(b_1, b_2) = (0, 0), V_d = V_{c4}$     IV

Where 0 is a LOW level signal and 1 is an HIGH level signal. By way of explanation, in condition I, both inputs of NAND gate 28 are HIGH level signals (1, 1) and, hence, the output thereof is an LOW level (0) signal. In response to a LOW level signal produced at the output of NAND gate 28, a LOW level signal is applied to the P-channel transistors of the transmission gate 33 and, as a result of inverter 32, a HIGH level signal is applied to the N-channel transistor of the transmission gate 33. Accordingly, the P-channel transistor of transmission gate 33 is turned OFF and the N-channel transistor of transmission gate 33 is turned ON to thereby apply the voltage at the point $c_1$ through the N-channel transistor 33 to the negative input of operational amplifier 40 as the detected voltage $V_d$. Simultaneously, therewith, the input of NAND gate 29 is $\bar{b}_2 = 0$, i.e., (1, 0), as a result of inverter 27 and, hence, the output of NAND gate 29 is a HIGH level signal (1). Accordingly, the input of the P-channel transistor of the transmission switch 35 is a HIGH level signal and the input to the N-channel transistor of the transmission gate 35 is a LOW level signal (0), as a result of inverter 34, to thereby turn OFF transmission switch 35 and prevent any signal from being transmitted therethrough. Similarly, the inputs applied to NAND gate 30 are $\bar{b}_1 = 0$, i.e., (0, 1), as a result of inverter 26 coupled to the $b_1$ output of the shift register 25, so that the output of NAND gate 30, like the output of NAND gate 29, is a HIGH level signal, and is applied to the P-channel transistor of transmission gate 37 and through the inverter 36 to the N-channel transistor of transmission gate 37 to thereby turn same OFF in the same manner as the transmission gate 35 discussed below. Finally, the input of the NAND gate 31 is $\bar{b}_1 = 0$, $\bar{b}_2 = 0$, i.e., (0, 0) as a result of inverters 26 and 27 so that an HIGH level output is also produced at the output of NAND gate 31. The HIGH level output produced at the output of NAND gate 31 is applied through inverter 38 to the P-channel transistor of transmission gate 39 and, additionally, is directly applied to the P-channel transistor or the transmission gate 39 to thereby turn same OFF in the same manner described above with respect to transmission gates 35 and 37. Thus, since transmission gate 33 is the only gate having a transistor therein turned ON, the voltage $V_{c1}$ is transferred to the comparison circuit in the manner discussed above. Moreover, in condition II, only transmission gate 35 is turned ON and, hence, the detected voltage $V_d = V_{c2}$. In condition III, only transmission gate 37 is turned ON and $V_{c3}$ is transferred to the comparison circuit as the detected voltage. Finally, in condition IV, only transmission gate 39 is turned ON so that the voltage $V_{c4}$ is transferred as the detected voltage $V_d$ to the comparator circuit 3.

Figure 5A:
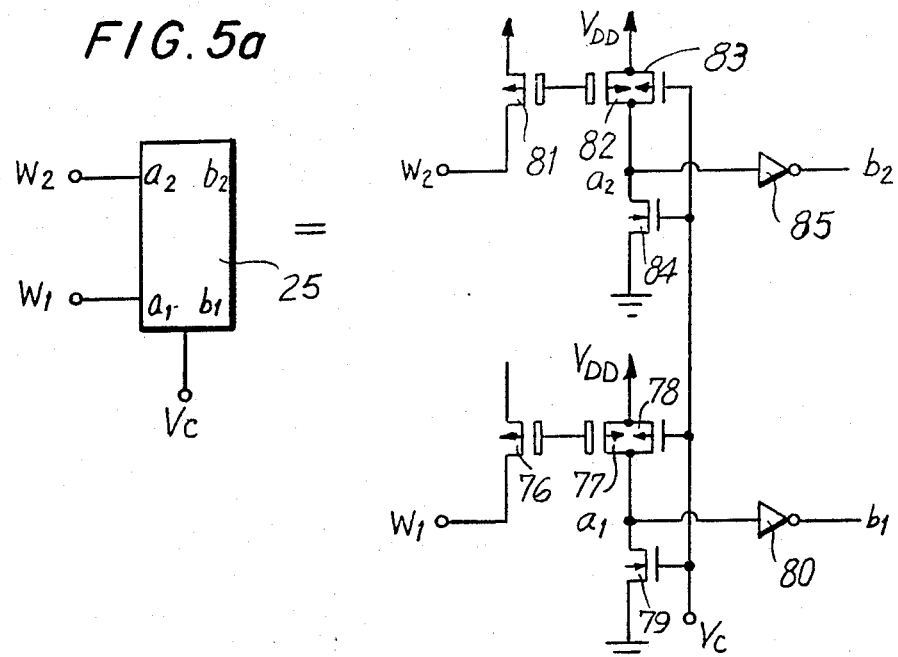
FIG. 5a is a circuit diagram of the adjustment control circuit depicted in FIG. 2.

In order to perform the adjustment of the level of the voltage detection signal $V_d$ applied to the comparator 3, a control circuit 25, comprised of non-volatile memory elements, is utilized. Reference is made to FIG. 5a wherein a detailed circuit diagram of control circuit 25 is depicted. FAMOS elements 76, 77, 81 and 82 are each provided with gates having no electrons injected therein and, accordingly, define holding circuits using reverse polarity FAMOS elements. Moreover, $V_c$ is $\bar{\phi}_3$ when $\phi_3$ is LOW. NT 79 and NT 84 are therefore switched ON when $(a_1, a_2) = 0, 0$, and their outputs are inverted by inverters 80 and 85. Thus, $v_d = V_{c1}$ which corresponds to $(b_1, b_2) = (1, 1)$. When $\phi_3$ is a HIGH level signal, PT 78 and PT 83 are turned ON so that $(a_1, a_2) = (1, 1)$ and no current flow is effected through the voltage reference circuit 1, the voltage converter circuit 2 and the comparator circuit 3 and, hence, these circuits are prevented from operating in their usual manner. In simple terms, the outputs of the control circuit 25, when $\phi_3$ is a LOW level signal, are utilized to produce the signal illustrated in the four conditions I through IV detailed above. Specifically, in condition I, $(a_1, a_2)=(0, 0)$, which state occurs when the gate electrodes of FAMOS elements 76, 77, 81 and 82 do not have electrons injected therein. In condition II, $(a_1, a_2)=(0, 1)$, so that the gate electrodes of FAMOS elements 81 and 82 are subject to electron injection. In condition III, $(a_1, a_2)=(1, 0)$, electrons are injected into the gate electrodes of FAMOS elements 76 and 77. Finally, in condition IV, $(a_1, a_2)=(1, 1)$, the gate electrodes of each of the FAMOS elements 76, 77, 81 and 82 are subject to electron injection.

Figure 5B:
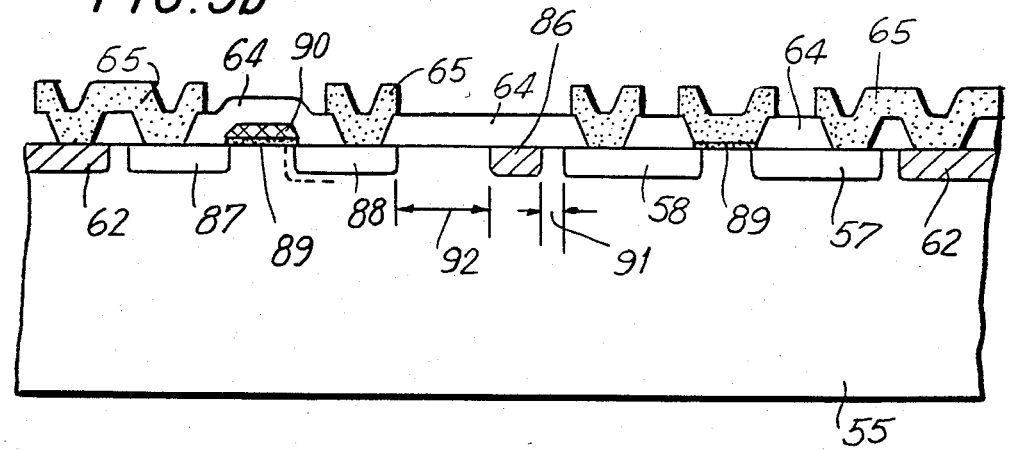

The construction of the FAMOS elements, depicted in FIG. 5a, is illustrated in detail in FIG. 5b. P-type layers 57 and 58 are formed in the N⁻ silicon substrate 55 and define source and drain regions of a P-channel transistor. P-type layers 87 and 88 define the source and drain regions of the FAMOS elements. N-type layer 62 serves as an isolation layer between the electrode and the substrate. Insulating film 89 defines a clean insulating film gate layer with field insulating film 64 and gate electrode 65 also being provided. Source-drain substrate electrodes are metallic layers formed of aluminum. Aluminum layer 90 provides a floating gate electrode for the FAMOS elements, which electrode is comprised of doped P⁻ or N⁻ polycrystalline silicon or of non-doped polycrystalline silicon. The injection of electrons into the gate electrodes of the FAMOS elements is obtained by effecting an avalanche breakdown between the N-type layers (62) and the P-type layers (88), namely, the depletion layer illustrated as the dotted line area in FIG. 5b between the substrate and the drain of the FAMOS elements for writing and injecting the electrons produced into the gate electrodes by accelerating the fields (shown by arrow in drawings). For this reason, the space 92, between isolation area 86 and the drain region 88 of the FAMOS elements, for writing in information, must be larger than the space 91, between the drain region 58 and the isolation layer 86 of an ordinary MOS element, so that the avalanche voltage at the PN junction between the drain region and substrate of the FAMOS elements to be written into, will not be hindered by the reverse breakdown voltage of the PN junction between the drain region and isolation layer thereof. As a practical matter, during fabrication of the integrated circuit chip, the length 91 can be selected relative to the length 92 for obtaining this result. Moreover, with respect to the floating gate electrode 90, polycrystalline silicon can be utilized to obtain multi-layer wiring or, alternatively, polycrystalline silicon can be used as the floating gate.

Figure 5C:
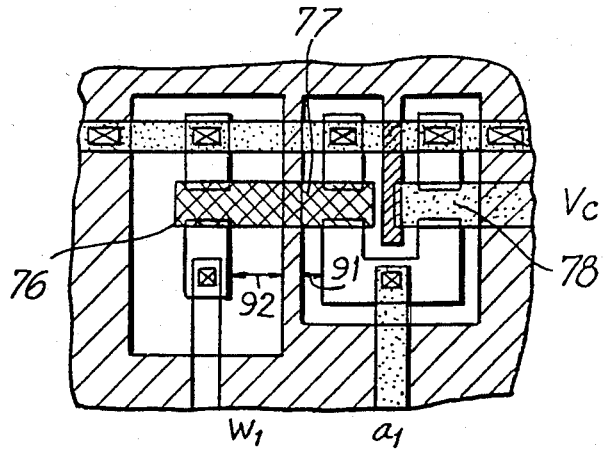

As is illustrated in FIG. 5a, FAMOS element 77, or FAMOS element 82, is subject to electron injection, and the impedance defined by NT 79 and NT 84 is a high impedance when same are turned ON so that the potential levels of $a_1, a_2$ are HIGH even when differentiation pulse $\phi_3$ is a LOW level signal and transistors 79 and 84 are turned ON. Since the impedance level becomes sufficiently low even when transistors 77 and 82 are similarly dimensioned (same channel length, same channel width and same gate insulating film thickness) to transistors 79 and 84, transistors 77 and 82 may be equal in size to transistors 79 and 84 only if transistors 77 and 82 are being fully subjected to an injection of electrons. To this end, reference is made to FIG. 5c, illustrating a pattern in which the FAMOS elements 76 and 77 and MOS transistor 78 are formed. The pattern, illustrated in FIG. 5c, is a plan view of the FAMOS elements illustrated in FIG. 5b. Thus, the oblique lines in FIG. 5c represent an N-type layer, serving as an isolation layer, and for permitting contact with the substrate, the blank portion is a P-type layer or substrate, and the hatched portion is a gate electrode of a FAMOS element formed, for example, of polycrystalline silicon. The dotted portion in FIG. 5c represents metallic layers defining the drain electrode and the source electrode. The drain source and gate electrodes are formed of aluminum. Finally, each block having an X therein illustrates the contact between a metal electrode and a P-type or N-type layer. In FAMOS element 76, which element is adapted to have information written therein, the space 92 between the drain region and isolation layer is larger than the space between the drain region and isolation layer of the MOS element 78 provided for reading out the information. Thus, a further feature of the instant invention is the use of non-volatile memory elements such as FAMOS elements so that adjustment of the circuitry can be effected directly by the regulation circuit when the integrated circuit chip is in a wafer state and, thereafter, once the integrated circuit chip is mounted in the electronic instrument, no further adjustment thereof is necessary.

Once completed, the adjustment circuit can be selectively disposed into one of four conditions to thereby select one of the four detected voltage values, $V_d$, to be applied to the comparator 3. The comparator circuit 3 is comprised of a comparator 40, which comparator receives at its negative (−) input the converted detected voltage $V_d$ and at its positive (+) input the reference voltage $V_{st}$. Additionally, the comparator circuit 40 is rendered operative in response to receiving LOW level differentiation pulse $\phi_3$ produced by the pulse generating circuit 5. The comparator 40 is a differential amplifier (operational amplifier) of the type illustrated in FIG. 3a, and compares an inverted input $V_I$ with a non-inverted input $V_{NI}$ in the usual manner. When $V_I > V_{NI}$, $V_o$=LOW (0) and when $V_I < V_{NI}$, $V_o$=HIGH (1).

As illustrated in FIG. 3a, the resolution power of the operational amplifier is determined by the open loop gain. Since, as a practical matter, this gain is typically 70 db to 80 db, low voltage levels ranging from 1/3,000 to 1/10,000 of the supply voltage are compared. Moreover, oscillations in the comparator are of no concern and, hence, the capacitance $C_1$ and $C_2$ is permitted to be small, so that the gate construction 59, illustrated in FIG. 4a, can be utilized in forming the operational amplifier rather than the gate construction 52, illustrated in FIG. 3b. Similarly, the ratio of conductance coefficients of the transistors 45 and 50 can be of a similar degree. Thus, the open loop gain of the differential amplifier (operational amplifier illustrated in FIG. 3a) can be higher if the channel length of the respective transistors comprising the amplification stage are made longer, the concentration of the substrate is increased and the thickness of the gate films is reduced. To increase the gain of the integrated circuit, the channel length of the respective transistors comprising the amplifier stages should be increased. The channel length of the amplifier transistors are characterized by being longer than the remaining transistors not disposed in the amplifier stage of the voltage detector and are also no longer than the channel length of the transistors utilized to form the electronic instrument in which the voltage detection circuit is incorporated.

Accordingly, the embodiment illustrated in FIG. 2, depicts the respective voltages applied to the comparator circuit as including the inverted input voltage $V_I$, which voltage equals the detected voltage $V_d$, and the non-inverted voltage $V_{NI}$, which voltage equals the set reference voltage $V_{st}$. When the regulation circuit 4 is in condition I, $$V_d = \frac{r_1}{R+r} \times V_d^o \text{ and } V_{st} = \frac{R_2}{R_1+R_2} V_{st}^o \text{ that } V_d^{o*} =$$

$$\frac{R_2}{R_1+R_2} \times \frac{R+r}{r_1} V_{st}^o$$

as a boundary condition, if $V°_d$ is greater than $V°_{d*}$, the output of the comparator becomes LOW (ground potential) and if $V°_d$ is less than $V°_{d*}$, the output of the comparator is a HIGH level ($V_{dd}$). Conversely, for a ratio of $R_2/R_1$, $r_i/R+r$ (i=1, 2, . . . ) and $V_{st}$ (=$V_{TP}$—$V_{GTP}$) must be selected so that detection of the detected voltage $V°_d$ is made at a desired level of $V°_{d*}$. Accordingly, it is a further feature of the instant invention that a set reference voltage, that is compared with the converted voltage, is compared by a differential amplifier comparator circuit.

Finally, once the differential amplifier comparator circuit 40 produces a comparison output $V_{comp}$, a memory circuit 6, comprised of a data storage flip-flop (shift register) 41, is provided. The shift register 41 is the same as shift register 7, illustrated in FIG. 6. Specifically, the output of the comparator 40, $V_{comp}$, is written into the write-in terminal W of the shift register 41, when $\phi_3$ is a LOW level signal. This is effected by applying the output $\phi_3$ through an inverter 9 to the clock input CL of the shift register 41. $V_{comp}$ is further amplified to an output $V_h$ produced at the Q output of the shift register 41 by inverters in the memory circuit. Specifically, as illustrated in FIG. 6, the inverter in the memory circuit defined by complementary pairs of transistors 96 and 97 or 102 and 103 amplify the output $V_{comp}$ produced by the comparator. Accordingly, in addition to the memory 6, differential pulse $\phi_3$ is applied to the reference voltage circuit 1, voltage converter circuit 2, comparator 3 and regulation circuit 4 to control same in the same manner as the memory. It is noted, however, that the output signal of the memory must be produced at all times and, accordingly, the dynamic characteristics of these other circuits when pulse $\phi_3$ is changed from a HIGH to a LOW binary state, namely, the transient characteristic of these circuits can often be problematical. For example, if the time $\tau_d$ required for the circuit to effect voltage detection and be disposed in a uniform static condition is subtracted from the period of the differential pulse $\phi_3$, then the memory is driven by the pulse $\phi_5$ in the manner illustrated in FIG. 7c. Specifically, $\phi_5$ is a pulse having a period $\tau_b$ (greater than $\tau_d$), equal to one-half period of the clock signal $\phi_4$, and is subtracted from the period of the signal $\phi_3$ by a shift register (flip-flop) 104 and NOR gate 105, illustrated in detail in FIG. 7b.

As aforenoted, the transient characteristic of the voltage detection circuit including the memory circuit, when pulse $\phi_3$ is changed from a LOW state to a HIGH state, causes transients in a similar manner. The memory circuit is driven by a pulse $\phi_6$, which pulse is equivalent to a fixed time interval $\tau_a$ (for one clock pulse of $\overline{\phi}_4$) and is subtracted from $\phi_5$. Pulse $\phi_6$ is produced by the shift register flip-flop 106, NAND gate 107 and inverter 108, illustrated in FIG. 7b. The circuit, illustrated in FIG. 7b, can also be included in the pulse generating circuit 5.

Although the embodiment, illustrated in FIG. 2 of this invention, adjusts the level of the converted voltages produced by the voltage converter circuit 2, the adjustment can also be achieved using the reference voltage circuit. Specifically, the set reference voltage $V_{st}$ can be adjusted to a different level by connecting resistors 17 and 18, instead of resistors 20, 21, 22, 23 and 24, to the output of the operational amplifier 19, so that $$V_d = \frac{R_2}{R_1+R_2} V_d^p$$

and, additionally, by connecting resistors 20, 21, 22, 23 and 24, instead of resistors 17 and 18, to the output of amplifier 16.

Moreover, depending upon the accuracy required for setting the reference voltage, adjustment can be entirely omitted by deleting the regulation circuit 4 and fixing the resistance, connected to the output of the amplifier 19, to provide the detected voltage $V_d$. In such an embodiment, it would be necessary to make $r_2=r_3=r_4=0$ and $r/r_1$ would be appropriately selected and connected to the comparator 40 so that the output $c_1$ would be applied thereto as the detected voltage $V_d$. Accordingly, the voltage detection circuit of the instant invention is particularly characterized by permitting the adjustment to be effected electronically by the circuitry integrated into the circuit chip with all of the adjustments being made before the circuit chip is mounted and by utilizing non-volatile memory elements to effect such adjustment. Moreover, once the integrated circuit is mounted, fully automated electronic adjustment of the integrated circuitry can be effected without manually varying any of the impedance characteristics of the integrated circuit.

Figure 8:
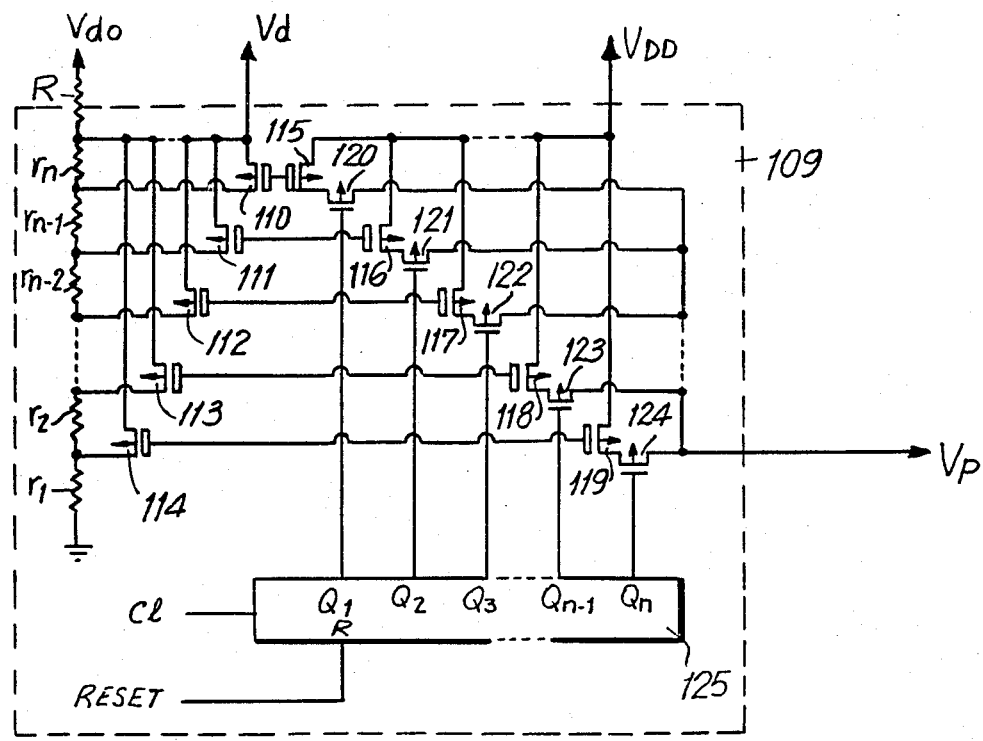
FIG. 8 is a circuit diagram of a further regulation circuit for use with a voltage detection circuit of the type depicted in FIG. 1.

Reference is now made to FIG. 8, wherein a further embodiment of an adjustment circuit, for use in the voltage detection circuit of the instant invention, is depicted. A plurality of non-volatile FAMOS memory elements 110 through 114, and 115 through 119, and a plurality of injection control transistors 120 through 114, are provided for controlling the ON or OFF characteristics of the FAMOS elements. Additionally, a shift register 125 includes outputs $Q_1$ through $Q_n$ respectively coupled to the gates of injection control transistors 120 through 124 to thereby render the FAMOS elements conductive in response to a clock signal C1 applied thereto. Each of the FAMOS transistors 110 through 114 are coupled to the output terminal $V_d$, which terminal produces a detected voltage to be applied to the comparator circuit. The converted input to be applied to the comparator is selectively varied by the resistors $R_2$ through $R_n$, which resistors are short circuited in response to the selective turning ON and turning OFF of the FAMOS elements 110 through 114. It is noted, however, that the gating circuit for selecting the resistors $r_2$ through $r_n$ are of duel gate construction so that FAMOS elements 100 and 115 and FAMOS elements 111 and 116, etc., are utilized to control the resistive network. The terminal $V_p$ can provide a write-in input for the purpose of injecting charge into the FAMOS elements with −30 V to −50 V impulses applied thereto.

Figure 9:
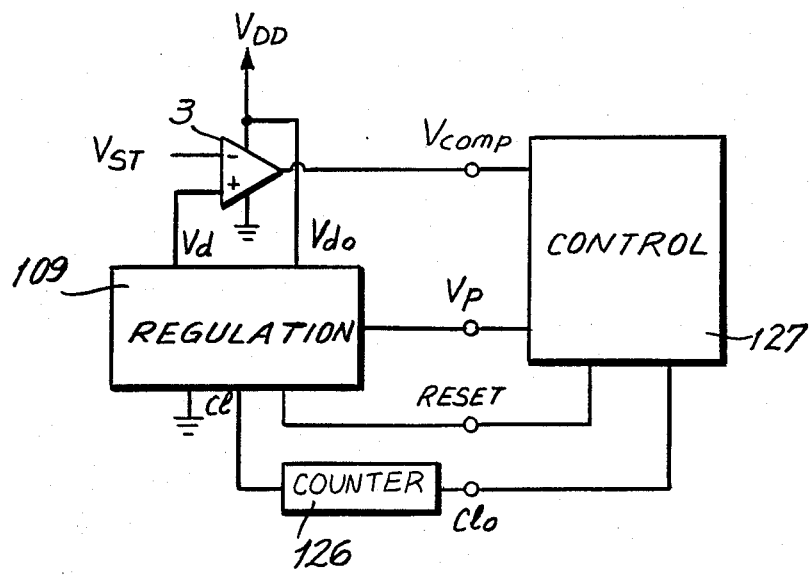
FIG. 9 is a block circuit diagram of an adjustment circuit for use in the regulation circuit depicted in FIG. 8.

An example of an automatic adjustment circuit for use in combination with the regulating circuit 109 is depicted in FIG. 9. The supply voltage is detected when it attains a desired or predetermined voltage, specifically, when $V_{do}=V_{DD}$. First, the supply voltage $V_{DD}$ is detected when same is slightly below the detected set reference voltage. In such event, the output voltage $V_{comp}$ of the comparator circuit 3 is a HIGH level signal. A control circuit 127 detects this, and applies to regulating circuit 109 a reset pulse and additionally applies a clock signal $C1_o$ to the regulating circuit 109 through a counter 126 to thereby actuate the shift register 125. When the outputs $Q_1$ through $Q_n$, of the register, are each reset to a LOW level, and an injection pulse is applied to the terminal $V_p$, FAMOS elements 110 through 114 are, in turn, switched ON. At this time, the potential of the voltage to be detected $V_d$ is gradually lowered in synchronism with each of the clock pulses applied thereto and, when it is sufficiently lowered below the reference potential $V_{st}$, the output $V_{comp}$ of the comparator is changed to a LOW level output. The control circuit 127 immediately detects the LOW level signal and stops the clock signal from being produced by the counter 126 so that adjustment of the circuit is completed. When the circuit is used, the comparator circuit 3 immediately detects when the level of the supply voltage is at the level of the set voltage. The regulating elements for use in this type of integrated circuit can also include injection type tunnel elements such as MNOS, etc., and are not limited to FAMOS elements.

Figure 10:
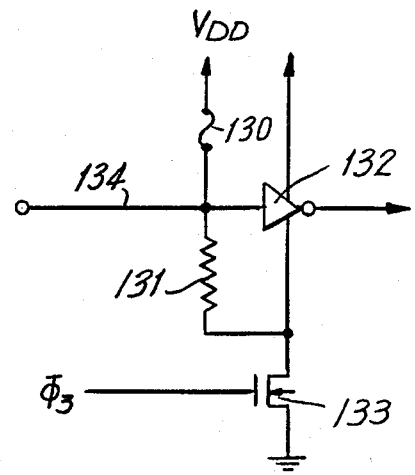
FIG. 10 is a circuit diagram of a further regulation circuit feature for use with the voltage detection circuit of the instant invention.

Additionally, a further adjustment circuit of the instant invention is depicted in FIG. 10. Specifically, the regulation circuit includes a fuse 130 (made up of metal or silicon, etc.) so that the detected voltage is adjusted by thermally cutting the fuse with a large current flow between input 134 and the voltage supply $V_{DD}$. In order to limit the duration of current consumption, it is preferred to utilize the differential pulse $\phi_3$ to turn ON and OFF the N-channel transistor 133. Other methods of cutting the fuse to adjust the circuit are also available if the portion of the circuit similar to the fuse is cut off using a laser, etc. Stated otherwise, all FAMOS elements, MNOS elements, fuses, etc., are non-volatile and, hence, are suitable for use as non-volatile memory elements in the adjustment circuit of the instant invention. Moreover, each of the non-volatile elements detailed above permit electronic adjustment of the regulating circuit to be incorporated into the electronic timepiece at the time that the integrated circuit chip is fabricated.

Figure 11:
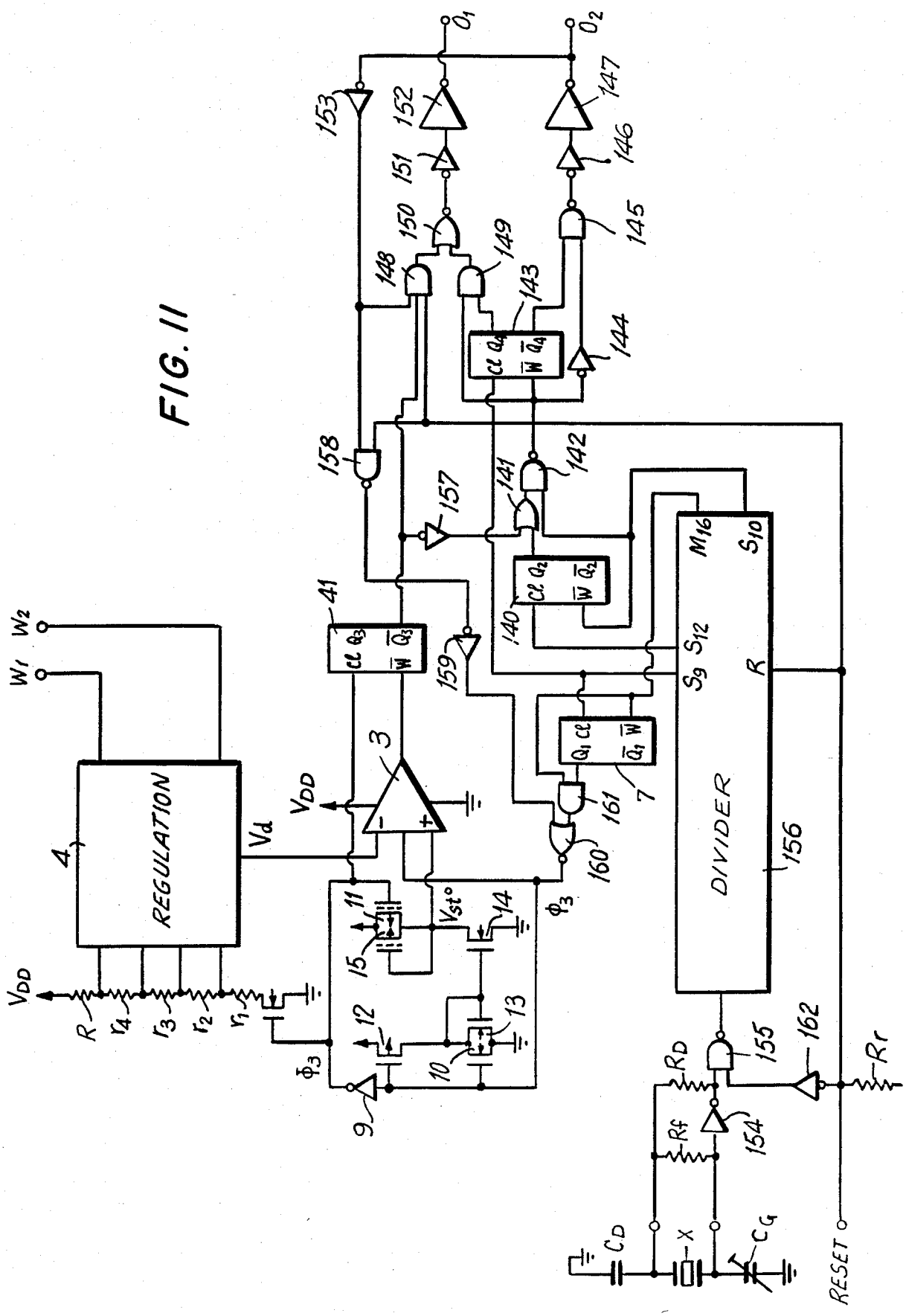
FIG. 11 is a block circuit diagram of an electronic wristwatch incorporating the voltage detection circuit of the instant invention.

Reference is now made to FIG. 11, wherein an electronic wristwatch movement, incorporating a voltage detection circuit having the internal adjustment means of the instant invention, is depicted. The voltage detection circuit is adapted to detect a decrease in the battery voltage and advise the wearer of the wristwatch when the battery is substantially dissipated in order to permit the wearer of the wristwatch to replace the battery. Like reference numerals are utilized in FIG. 11 to denote like elements described above.

Regulation circuit 4 includes write-in inputs $W_1$ and $W_2$ and is coupled to the voltage detection network for applying a detected voltage $V_d$ to the comparator circuit 3. The voltage reference circuit includes elements 9 through 15 for applying a set reference voltage $V°_{st}$ to the comparator 3. The output of the comparator 3 is applied to the write-in input of the memory flip-flop 41. The shift register 7 and AND gate 161 define a pulse generating circuit, of the type described above, for generating differential sampling pulses $\phi_3$.

It is noted that the reference voltage $V°_{st}$ is directly supplied to the comparator 3 and the detected voltage is linearly related to the supply voltage by the resistive network.

With respect to the electronic wristwatch movement, an inverter 154 is disposed intermediate a drain resistor $R_d$ and a feedback resistor $R_f$, and is coupled to a quartz crystal X to define a conventional quartz crystal oscillator circuit including capacitor $C_D$ and variable capacitor $C_G$ for producing a high frequency time standard signal. The high frequency time standard signal is applied through NAND gate 155 to a high frequency divider comprised of sixteen series-connected binary divider stages. The NAND gate is controlled by an inverter 162 and resistor $R_r$ for permitting or inhibiting the high frequency time standard signal from being applied to the dividers. Adjustment of this timekeeping circuit is made in the following manner.

First, a HIGH level reset signal is applied to the reset terminal R of the divider 156 to thereby set same to zero. As soon as the lower frequency stages of the divider are reset, the shift register flip-flop 7, 140 and 143 each become $\overline{W}=\overline{Q}_i (i=2.4)$ for a half a bit of information. Accordingly, when the reset signals are applied, the output signals $O_1$ and $O_2$ applied to the step motor drive coil for driving the hands are both HIGH level pulses. If the terminal $O_2$ is forced to be a LOW level, gates 148 and 158 are turned ON to permit the sampling pulses $\phi_3$ and $\overline{\phi}_3$ to be applied to the voltage detection circuit and open each of the gates, so that each of the circuits are ready to effect a detection function. Additionally, a sample pulse $\overline{\phi}_3$ is applied to the clock terminal C1 of flip-flop 41 to thereby write-in the detected data produced by the comparator circuit 3 and supply same at the output $\overline{Q}_3$ of the flip-flop 41 to a second input of AND gate 148. AND gate 148 is coupled through a NOR gate 105, inverter 151 and inverter 152 to the output terminal $O_1$. The comparator is adjusted to detect when the magnitude of the voltage supplied by the voltage supply $V_{DD}$ drops below a predetermined set reference voltage selected by the FAMOS elements, by applying signals to write-in terminals $W_1$ and $W_2$ of the regulation circuit so that a fixed level of the detected voltage can be selected. Thereafter, the power supply is restored to its original state and the reset signal is no longer applied. When the reset signal is released, the driving pulses are delivered to output terminals $O_1$ and $O_2$ in alternating fashion once each second in the usual manner.

Since the date input $\overline{W}$ of the flip-flop 7 uses a master signal $M_{16}$ produced at the output of the last (16th) stage of the frequency divider, a differential sampling pulse $\phi_3$ having a time delay of 0.5 seconds with respect to leading edges of the motor driving signals applied to output terminals $O_1$ and $O_2$ is produced, thereby accomplishing voltage detection in a short interval of time, such as once in every two second period, thereby storing the voltage detection information in the memory flip-flop 41. If the level of the battery voltage to be detected decreases to the level of the set reference voltage to be detected, the output of the comparator is inverted, thereby actuating gate 141 to thereby apply a write-in input W to flip-flop 143 having a duty cycle reduced by the clock signal $S_{12}$. As a result thereof, time based output signals are successively produced at the output terminals $O_1$ and $O_2$ and, hence, do not alternate once each second so that the second hand of the timepiece is now advanced two steps at the beginning of each two second period instead of one step each second, thereby providing an indication to the wearer of the wristwatch that the voltage level of the battery has dropped to a detected level.

Figure 12A:
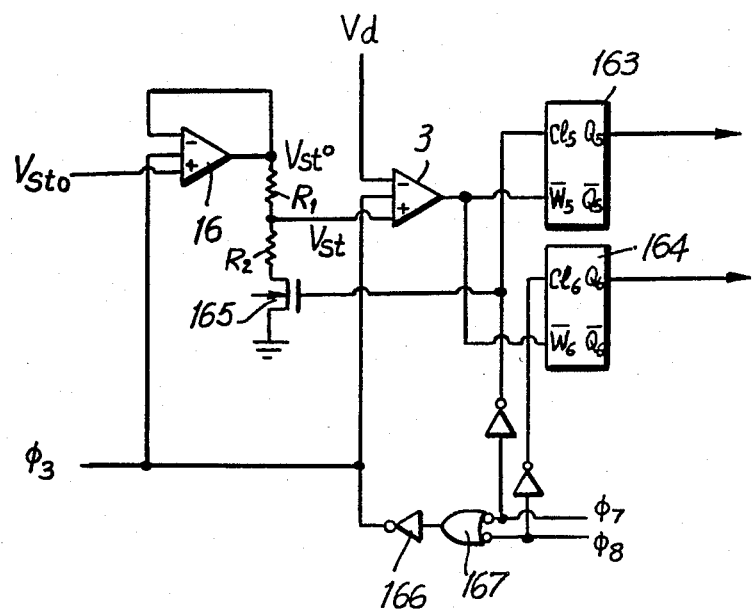
FIG. 12a is a multi-level voltage detection circuit constructed in accordance with the instant invention.
Figure 12B:
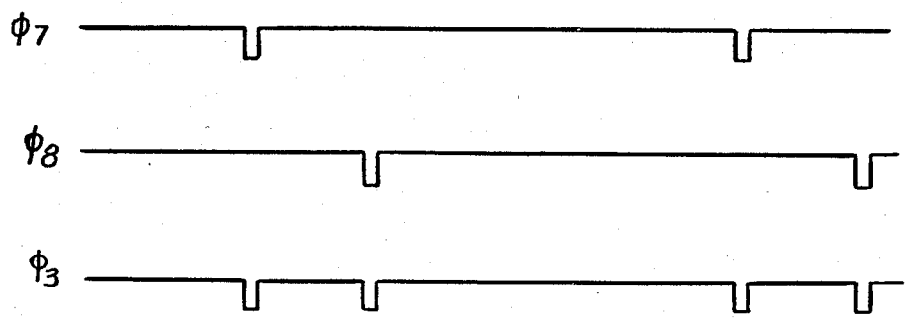

It is noted that a voltage detection circuit, constructed in accordance with the instant invention, is capable of detecting more than two levels. In FIG. 12a, a voltage detection circuit, for detecting a voltage of two levels, is depicted. Out of phase drive signal $\phi_7$ and $\phi_8$ are respectively applied to OR gate 167 and flip-flop 163 and OR gate 167 and flip-flop 167. The voltage detection circuit is therefore actuated when each signal is applied thereto. However, transistor 165 is turned OFF when $\phi_8$ is applied and the set reference voltage $V°_{st}$ is used as a reference potential, and when $\phi_7$ is applied, transistor 165 is turned ON so that a reference potential equal to $R_2/R_1+R_2$ is produced allowing two detection levels. The outputs of comparator 3, detected at each timing interval, are respectively stored by flip-flops 163 and 164. For the detected voltage $V_d$ to be varied, if required, a regulation circuit can be added to the embodiment illustrated in FIG. 12a. The circuited, depicted in FIG. 12a, is particularly suitable for use in a timepiece and, in particular, a rechargeable type timepiece having solar cells. A timing signal $\phi_7$ permits detection of a decrease in the voltage of the secondary battery and a warning is displayed through the output $Q_5$ for advising the wearer prior to a charging of the timepiece, whereas the timing signal $\phi_8$ would detect a rise in the voltage of the secondary battery because of overcharging and would thereby prevent overcharging in response to producing a change in the state of the output signal $Q_6$ produced by flip-flop 164.

Accordingly, an integrated voltage detection circuit, constructed in accordance with the instant invention, includes an adjusting circuit that is fabricated into a monolithic IC which is particularly suitable for use in small-sized electronic instruments such as a timepiece, since the voltage detection circuit is readily integrated into a circuit chip with the remaining circuits of the instrument. Moreover, the regulation circuit of the voltage detection circuit allows electronic adjustment of the operation of the circuit in order to compensate for fluctuations between the voltages utilized to operate the integrated circuits.

The voltage detection circuits of the instant invention are particularly advantageous since they do not require any trimmers, capacitors or resistors to be externally mounted and is characterized by stable operation of the circuits in response to variations in temperature and variations in the supply voltage. For use in an integrated circuit of the type found in an electronic timepiece the voltage detection circuit of the instant invention can effect miniaturization of the electronic timepiece, cost reduction by eliminating external adjustment elements which results in a considerable cost saving in manufacture and in presale service.

It will thus be seen that the objects set forth above, among those made apparent from the preceding description, are efficiently attained and, since certain changes may be made in the above construction without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A reference voltage circuit to which a source voltage is applied comprising at least first and second pairs of complementary coupled P-channel and N-channel MOS transistors, said P-channel transistors in said first pair being coupled in series with said N-channel transistor in said first pair, said P-channel transistor in said second pair being coupled in series with said N-channel transistor in said second pair, at least one of said transistors in said first pair of complementary coupled P-channel and N-channel transistors having a different threshold voltage than the like polarity transistor in the second pair of complementary coupled P-channel and N-channel transistors, said first and second pairs of complementary coupled P-channel and N-channel MOS transistors defining at least a first predetermined voltage having a magnitude that is related to the difference in threshold voltages between said respective like polarity transistors in said first and second pairs, said predetermined voltage being substantially independent of variations in temperature and minor variations in said source voltage, said first and second pairs of complementary coupled P-channel and N-channel MOS transistors producing a set reference output voltage at said predetermined voltage in response to said source voltage, said at least first and second pairs of complementary coupled P-channel and N-channel MOS transistors being integrated into a single circuit chip.

2. The reference voltage circuit as claimed in claim 1, wherein at least one of said P-channel and N-channel transistors in said first pair includes a first gate and a first drain, said first gate being coupled to said first drain.

3. The reference voltage circuit as claimed in claim 2, wherein the other of said P-channel and N-channel transistors in said first pair includes a second gate, said transistor in said second pair which is of like polarity to said other transistor in said first pair having a third gate and a second drain, said second gate of said other transistor in said first pair and said third gate of like polarity transistor in said second pair both being coupled to said second drain of said like polarity transistor in said second pair.

4. The reference voltage circuit as claimed in claim 1, wherein said P-channel transistor in said first pair of transistors includes a gate and a drain, said gate being coupled to said drain, said N-channel transistor in said first pair having a gate, said N-channel transistor in said second pair of transistors including a gate and a drain, said gate of said N-channel transistor in said first pair and said gate of said N-channel transistor in said second pair being coupled to said drain of said N-channel transistor in said second pair of transistors.

5. In an integrated circuit on a single circuit chip, the improvement comprising a source voltage, a reference voltage circuit means for receiving said source voltage integrated into the same circuit chip as said integrated circuit, said reference voltage circuit means including at least first and second pairs of complementary coupled P-channel and N-channel MOS transistors, said P-channel transistor in said first pair being coupled in series with said N-channel transistor in said first pair, said P-channel transistor in said second pair being coupled in series with said N-channel transistor in said second pair, at least one of said transistors in said first pair of complementary coupled P-channel and N-channel transistors having a different threshold voltage than the like polarity transistor in the second pair of complementary coupled P-channel and N-channel transistors, said reference voltage circuit means defining at least a first predetermined voltage having a magnitude that is related to the difference in threshold voltages between said respective like polarity transistors in said first and second pairs, said predetermined voltage being substantially independent of variations in temperature and minor variations in said source voltage, said reference voltage circuit means producing a set reference output voltage at said predetermined voltage in response to said source voltage.

6. The integrated circuit as claimed in claim 5, wherein at least one of said P-channel and N-channel transistors in said first pair includes a first gate and a first drain, said first gate being coupled to said first drain.

7. The integrated circuit as claimed in claim 6, wherein the other of said P-channel and N-channel transistors in said first pair includes a second gate, said transistor in said second pair which is of like polarity to said other transistor in said first pair having a third gate and a second drain, said second gate of said other transistor in said first pair of said third gate of like polarity transistor in said second pair both being coupled to said second drain of said like polarity transistor in said second pair.

8. The integrated circuit as claimed in claim 5, wherein said P-channel transistor in said first pair of transistors includes a gate and a drain, said gate being coupled to said drain, said N-channel transistor in said first pair having a gate, said N-channel transistor in said second pair of transistors including a gate and a drain, said gate of said N-channel transistor in said first pair and said gate of said N-channel transistor in said second pair being coupled to said drain of said N-channel transistor in said second pair of transistors.

* * * * *